United States Patent [19]

Asrar et al.

[11] Patent Number: 5,117,327
[45] Date of Patent: May 26, 1992

[54] NORBORNENE DICARBOXIMIDE POLYMER DIELECTRIC DEVICES

[75] Inventors: Jawed Asrar, Chesterfield; Christopher J. Hardiman, University City, both of Mo.

[73] Assignee: Monsanto Company, St. Louis, Mo.

[21] Appl. No.: 629,887

[22] Filed: Dec. 19, 1990

[51] Int. Cl.$^5$ .................. H01G 4/08; C08G 69/00
[52] U.S. Cl. ............................ 361/323; 526/92
[58] Field of Search ............ 361/323; 548/522; 260/78 VA; 526/90, 91

[56] References Cited

U.S. PATENT DOCUMENTS

| | | | |
|---|---|---|---|
| 3,959,234 | 5/1976 | Kurosawa et al. | 526/92 |
| 4,945,170 | 7/1990 | Kohli | 548/522 |
| 4,965,330 | 10/1990 | Asrar | 526/259 |

FOREIGN PATENT DOCUMENTS 1594934  6/1970  France .

OTHER PUBLICATIONS

J. Asrar, "Norbornene Dicarboximide Polymers" (U.S. Ser. #07/196,992).

Gazit et al., "Low Dielectric Circuit Materials for High Speed Digital Systems".

Balde et al., "Low Dielectric Constant-The Substrate of the Future".

*Primary Examiner*—Donald Griffin
*Attorney, Agent, or Firm*—Thomas E. Kelley; Richard H. Shear

[57] ABSTRACT

Electrical devices, e.g. molded circuit boards, connectors and capacitors, fabricated from electrical insulating component, comprising norbornene dicarboximide thermoplastic polymer exhibiting a glass transition temperature greater than about 200° C., moisture absorption after equilibrating in boiling water of less than about 3 weight percent and an electrical permittivity at 1000 hertz measured at 25° C. and 50 percent relative humidity of less than 2.8. Preferred polymers comprise N-methyl norbornene dicarboximide, N-ethyl norbornene dicarboximide, N-propyl norbornene dicarboximide, N-butyl norbornene dicarboximide, N-trifluoroethyl norbornene dicarboximide, N-phenyl norbornene dicarboximide, N-trifluoromethylphenyl norbornene dicarboximide, N-cyclohexyl norbornene dicarboximide, N-cycloheptyl norbornene dicarboximide, N-cyclooctyl norbornene dicarboximide.

7 Claims, No Drawings

NORBORNENE DICARBOXIMIDE POLYMER DIELECTRIC DEVICES

Disclosed herein are electrical devices having dielectric components fabricated from norbornene dicarboximide polymer which has a dielectric permittivity of less than 2.8.

BACKGROUND OF THE INVENTION

The speed and power requirements of microelectronic devices, e.g. capacitors, supporting substrates and connectors, and the like are critically dependent on the dielectric properties of the materials of construction of such devices. For instance, the net speed of a microelectronic device is equivalent to the sum of all the circuit delays. A major source of circuit delay is the time required for an electrical pulse to travel between gates. For a bipolar circuit the propagation velocity is inversely proportional to the square root of the dielectric permittivity of the substrate, which is often a polymeric material. Thus, reducing the permittivity of the substrate results in an increased device speed or an expansion of the circuit dimensions without a loss in speed. The reduced capacitance associated with circuit traces allows a closer spacing of circuit elements without excessive levels of crosstalk. Reduction of line capacitance also directly reduces power consumption, which in turn reduces the heat output of the device.

High performance polymers are finding expanded uses in electrical and electronic devices owing to the ease of fabrication of parts from such polymers and the favorable balance of properties such as low weight, high temperature resistance, solvent resistance, high tensile strength, low moisture absorption and low dielectric permittivity. Typical flexible printed circuit interconnections are fabricated from polyimides, polyesters, fluoropolymers and reinforced epoxy laminates. Only the fluorocarbons have relatively low permittivity, e.g. about 2. The fluorocarbons, however, suffer from two main limitations, e.g. low melting point (typically less than 260° C.) and poor dimensional stability. The other polymeric materials typically have permittivities of about 3 or higher. In the case of polyimides the dielectric permittivity can be as low a about 2.8 when dry; however due to the tendency to absorb moisture the permittivity will rise to about 3.2 with moisture absorption.

SUMMARY OF THE INVENTION

This invention provides electronic and electrical devices which comprise an electrical conducting component and a polymeric electrical insulating component fabricated from a polymer comprising norbornene dicarboximide units. Such polymeric electrical insulating components exhibit high heat resistance, e.g. a glass transition temperature (Tg) greater than about 200° C., low moisture absorption and low increase in permittivity with moisture absorption. For instance, after equilibrating in boiling water certain preferred polymers of norbornene dicarboximides exhibit less than about 3 percent weight increase and an electrical permittivity of less than 2.8 measured in 25° C. air at 50 percent relative humidity, e.g. over a frequency range of 10 to 100,000 hertz. Preferred electrical insulating polymers comprise units of N-cycloalkyl norbornene dicarboximide, e.g. N-cycloalkyl norbornene dicarboximide where the cycloalkyl units range from cyclopropyl to cyclooctyl. Especially preferred are polymers comprising N-cyclohexyl norbornene dicarboximide units. Preferred devices include circuit boards, e.g. molded circuit boards, and other substrates for mounting electronic circuits or microelectronic devices, connectors and capacitors.

DETAILED DESCRIPTION OF PREFERRED EMBODIMENTS

The electrically insulating polymer used in the electrical/electronic devices of this invention can be a saturated or unsaturated homopolymer or copolymer comprising norbornene dicarboximide units preferably selected from the group consisting of N-methyl norbornene dicarboximide, N-ethyl norbornene dicarboximide, N-propyl norbornene dicarboximide, N-butyl norbornene dicarboximide, N-trifluoroethyl norbornene dicarboximide, N-phenyl norbornene dicarboximide, N-trifluoromethylphenyl norbornene dicarboximide, N-cyclohexyl norbornene dicarboximide, N-cycloheptyl norbornene dicarboximide, N-cyclooctyl norbornene dicarboximide. Although polymers of N-methyl norbornene dicarboximide exhibit a favorable dielectric permittivity about 2.6 when dry as molded, the polymer is sufficiently hygroscopic that it can absorb about 7 percent water. Because of its high affinity for water the permittivity of homopolymers of N-methyl norbornene dicarboximide increases to about 3.1 after equilibrating in room temperature air at 50% relative humidity. Such adverse effects caused by moisture absorption can be avoided by maintaining the electronic device in a dry environment or, more preferably, by incorporating hydrophobic monomer units into the polymer. For instance, copolymers comprising units of N-cyclohexyl norbornene dicarboximide or N-trifluoroethyl norbornene dicarboximide have increased hydrophobicity, resulting on lower water absorption and low permittivity that is not adversely affected by humid environments. For example, a preferred copolymer of N-cyclohexyl norbornene dicarboximide and N-trifluoroethyl norbornene dicarboximide (monomer units in the ratio of 9:1) exhibits a especially advantageous permittivity of about 2.2.

The polymers useful in the devices of this invention can be simply prepared using well known metathesis ring-opening polymerization techniques, including melt polymerization and solution polymerization where the monomer is dissolved in solvent such as toluene or dichloroethane, using conventional metathesis polymerization catalysts such as tungsten hexachloride catalyst with aluminum alkyl initiator or ruthenium chloride catalyst. Preferred catalyst systems are the non-pyrophoric catalysts, comprising ruthenium initiator and tungsten catalyst, disclosed by Hardiman in U.S. application Ser. No. 07/531,663, incorporated herein by reference. Because the N-cycloalkyl norbornene dicarboximide monomers have a melt point less than 150° C., such polymers are advantageously prepared by melt polymerization, e.g. in an extruder, using conventional metathesis polymerization catalyst systems. Because certain of the norbornene dicarboximide monomers form eutectic mixtures low temperature melt polymerization is possible. For instance, copolymers of N-methyl and N-cycloalkyl norbornene dicarboximide are advantageously prepared by melt polymerization at temperatures lower than the melting point of either monomer, i.e. about 115° C. for N-methyl norbornene dicarboximide and about 140° C. for N-cyclohexyl norbornene dicarboximide. Monomer mixtures of about 25-70% N-cyclohexyl norbornene dicarboximide melt at temperatures of 85°-100° C. and monomer mixtures of about 50-60% N-cyclo-hexyl norbornene dicarboximide melt at eutectic temperatures of 85°-90° C. Such melt polymerization conducted at lower temperatures reduces the polymer's exposure to the potentially deleterious effects of higher temperature polymerization.

The polymers of norbornene dicarboximides have advantageously high Tg, e.g. greater than 150° C., in some cases greater than 200° C., thus allowing electronic devices such as circuit boards, connectors and such that are useful in high temperature applications. Such devices can be readily fabricated by injection molding techniques.

The devices of this invention are prepared from norbornene dicarboximides selected on the basis of dielectric permittivity as indicated in the following table:

TABLE 1

| Imide Group | Permittivity* |
|---|---|
| homopolymers | |
| $-CH_3$ | 2.4 |
| $-CH_3$ | 3.1 (50% RH) |
| $-C_6H_{11}$ | 2.4 |
| $-C_6CH_{11}$ | 2.6 (50% RH) |
| $-p-Cl-C_6H_4$ | 2.3 |
| copolymers | |
| $-CH_3/o-CF_3CH_2-C_6H_4-$ | 2.3 |
| $-CH_3/p-CF_3CH_2-C_6H_4-$ | 2.5 |
| $-CH_3/CF_3CH_2-$ | 2.4 |
| $-C_6H_{11}/m-CF_3CH_2-C_6H_4-$ | 2.4 |
| $-C_6H_{11}/o-CF_3CH_2-C_6H_4-$ | 3.1 |
| $-C_6H_{11}/p-CF_3CH_2-C_6H_4-$ | 2.5 |
| $-C_6H_{11}/CF_3CH_2-$ | 2.2 |

Permittivity was measured at 1000 hertz on a dry molded sample in a dry nitrogen atmosphere at 100° C., except where for measurements indicated by "50% RH" which were measured on a sample equilibrated in a 50% relative humidity air at 25° C.

While specific embodiments have been described herein, it should be apparent to those skilled in the art that various modifications thereof can be made without departing from the true spirit and scope of the invention. Accordingly, it is intended that the following claims cover all such modifications within the full inventive concept.

What is claimed is:

1. A device comprising an electrical conducting component and an electrical insulating component, wherein said electrical insulating component comprises a thermoplastic polymer exhibiting a glass transition temperature greater than about 200° C., moisture absorption after equilibrating in boiling water of less than about 3 weight percent and an electrical permittivity at 1000 hertz measured at 25° C. and 50 percent relative humidity of less than 2.8, wherein said polymer comprises units of norbornene dicarboximide.

2. A device according to claim 1 comprising a molded circuit board, a connector or a capacitor.

3. A device according to claim 1 wherein said norbornene dicarboximide units comprise N-cycloalkyl norbornene dicarboximide units wherein said cycloalkyl units range from cyclopropyl to cyclooctyl.

4. A device according to claim 1 wherein said polymer is a saturated or unsaturated homopolymer or copolymer comprising units selected from the group consisting of N-methyl norbornene dicarboximide, N-ethyl norbornene dicarboximide, N-propyl norbornene dicarboximide, N-butyl norbornene dicarboximide, N-trifluoroethyl norbornene dicarboximide, N-phenyl norbornene dicarboximide, N-trifluoromethylphenyl norbornene dicarboximide, N-cyclohexyl norbornene dicarboximide, N-cycloheptyl norbornene dicarboximide, and N-cyclooctyl norbornene dicarboximide.

5. A device according to claim 1 wherein said polymer exhibits electrical permittivity of less than 2.8 when measured at 25° C. and 50 percent relative humidity over a frequency range of 10 to 100,000 hertz.

6. A device according to claim 1 wherein said thermoplastic polymer is prepared by metathesis ring-opening polymerization of norbornene dicarboximide monomer units.

7. A device according to claim 6 wherein said polymer is a saturated or unsaturated homopolymer or copolymer prepared by metathesis ring-opening polymerization of monomer units selected from the group consisting of N-methyl norbornene dicarboximide, N-ethyl norbornene dicarboximide, N-propyl norbornene dicarboximide, N-butyl norbornene dicarboximide, N-trifluoroethyl norbornene dicarboximide, N-phenyl norbornene dicarboximide, N-trifluoromethylphenyl norbornene dicarboximide, N-cyclohexyl norbornene dicarboximide, N-cycloheptyl norbornene dicarboximide, and N-cyclooctyl norbornene dicarboximide.

* * * * *